United States Patent
Kitabatake et al.

(10) Patent No.: US 7,786,565 B2
(45) Date of Patent: Aug. 31, 2010

(54) SEMICONDUCTOR APPARATUS INCLUDING POWER SEMICONDUCTOR DEVICE CONSTRUCTED BY USING WIDE BAND GAP SEMICONDUCTOR

(75) Inventors: Makoto Kitabatake, Nara (JP); Osamu Kusumoto, Nara (JP); Masao Uchida, Osaka (JP); Kunimasa Takahashi, Osaka (JP); Kenya Yamashita, Osaka (JP)

(73) Assignee: Panasonic Corporation, Osaka (JP)

( * ) Notice: Subject to any disclaimer, the term of this patent is extended or adjusted under 35 U.S.C. 154(b) by 25 days.

(21) Appl. No.: 10/536,828

(22) PCT Filed: Sep. 6, 2004

(86) PCT No.: PCT/JP2004/013263

§ 371 (c)(1),
(2), (4) Date: May 27, 2005

(87) PCT Pub. No.: WO2005/024941

PCT Pub. Date: Mar. 17, 2005

(65) Prior Publication Data

US 2006/0055027 A1 Mar. 16, 2006

(30) Foreign Application Priority Data

Sep. 4, 2003 (JP) .............................. 2003-313111

(51) Int. Cl.
*H01L 23/492* (2006.01)
(52) U.S. Cl. ..................... 257/689; 257/707; 257/796; 257/E23.103; 257/E23.187
(58) Field of Classification Search ................. 257/688, 257/689, 690, 692–698, 706, 796, 707, 687, 257/723, 728, 778; 438/124, 126
See application file for complete search history.

(56) References Cited

U.S. PATENT DOCUMENTS 5,073,817 A 12/1991 Ueda (Continued)

FOREIGN PATENT DOCUMENTS

CN 1355564 6/2002

(Continued)

OTHER PUBLICATIONS

Koji Imai, "Power Electronics Handbook (R & D Planning)," edited by Koji Imai (p. 602) (discussed in Background portion of the specification).

(Continued)

*Primary Examiner*—Wael M Fahmy
*Assistant Examiner*—Abul Kalam
(74) *Attorney, Agent, or Firm*—McDermott Will & Emery LLP

(57) ABSTRACT

A semiconductor apparatus includes a semiconductor chip 61 including a power semiconductor device using a wide band gap semiconductor, base materials 62 and 63, first and second intermediate members 65 and 68a, a heat conducting member 66, a radiation fin 67, and an encapsulating material 68 for encapsulating the semiconductor chip 61, the first and second intermediate member 65 and 68a and the heat conducting member 66. The tips of the base materials 62 and 63 work respectively as external connection terminals 62a and 63a. The second intermediate member 68a is made of a material with lower heat conductivity than the first intermediate member 65, and a contact area with the semiconductor chip 61 is larger in the second intermediate member 68a than in the first intermediate member.

10 Claims, 10 Drawing Sheets

U.S. PATENT DOCUMENTS

| | | | |
|---|---|---|---|
| 5,227,663 A * | 7/1993 | Patil et al. | 257/718 |
| 5,293,301 A | 3/1994 | Tanaka et al. | |
| 5,324,888 A | 6/1994 | Tyler et al. | |
| 5,455,457 A * | 10/1995 | Kurokawa | 257/712 |
| 5,793,118 A * | 8/1998 | Nakajima | 257/790 |
| 6,157,080 A * | 12/2000 | Tamaki et al. | 257/738 |
| 6,184,580 B1 * | 2/2001 | Lin | 257/712 |
| 6,215,176 B1 | 4/2001 | Huang | |
| 6,507,047 B2 * | 1/2003 | Litwin | 257/77 |
| 6,566,164 B1 * | 5/2003 | Glenn et al. | 438/107 |
| 6,590,281 B2 * | 7/2003 | Wu et al. | 257/684 |
| 6,703,707 B1 * | 3/2004 | Mamitsu et al. | 257/718 |
| 2001/0045644 A1* | 11/2001 | Huang | 257/718 |
| 2002/0140067 A1* | 10/2002 | Hori | 257/675 |
| 2002/0158333 A1* | 10/2002 | Teshima | 257/718 |
| 2002/0179945 A1 | 12/2002 | Sakamoto et al. | |
| 2003/0132530 A1 | 7/2003 | Teshima et al. | |
| 2003/0155644 A1 | 8/2003 | Hirao et al. | |
| 2004/0056346 A1 | 3/2004 | Palm et al. | |
| 2004/0080028 A1* | 4/2004 | Yanagisawa | 257/675 |
| 2004/0089934 A1 | 5/2004 | Shimoida et al. | |
| 2005/0062148 A1* | 3/2005 | Seo et al. | 257/712 |

FOREIGN PATENT DOCUMENTS

| | | |
|---|---|---|
| DE | 100 58 446 A1 | 5/2001 |
| DE | 100 62 108 A1 | 6/2002 |
| EP | 0 777 273 A | 6/1997 |
| EP | 0 867 935 A | 9/1998 |
| FR | 2 758 908 | 7/1998 |
| JP | 57-096556 A | 6/1982 |
| JP | 57-133653 A | 8/1982 |
| JP | 5-121603 | 5/1993 |
| JP | 08-064634 A | 3/1996 |
| JP | 11-274482 | 10/1999 |
| JP | 2001-156225 | 6/2001 |
| JP | 2002-33445 | 1/2002 |
| JP | 2002-208673 | 7/2002 |
| JP | 2002-368121 | 12/2002 |
| JP | 2003-17658 | 1/2003 |
| JP | 2003-197859 | 7/2003 |
| JP | 2003-243612 | 8/2003 |
| JP | 2004-140068 | 5/2004 |
| JP | 2004-214368 | 7/2004 |
| WO | WO 98/52221 A | 11/1998 |

OTHER PUBLICATIONS

Chinese Office Action, with English Translation, issued in Corresponding Chinese Patent Application No. 200480003582.3, dated on Aug. 31, 2007.

Lutz et al., Technische Universitat Chemnitz, "Stand und Entwicklungstendenzen bei schnellen Dioden," 20020301, Mar. 1, 2002, XP002491991; and partial English translation thereof.

Matsunami H Ed—Institute of Electrical and Electronics Engineers: "Progress in Wide Bandgap Semiconductor SiC for Power Devices," 12th International Symposium on Power Semiconductor Devices and IC S. ISPSD 2000. Proceedings. Toulouse, France, May 22-25, 2000; [International Symposium on Power Semiconductor Devices & IC'S], New York, NY : IEEE, US, May 22, 2000, pp. 3-09, XP000987827.

Supplementary European Search Report issued in Patent Application No. 04772945.4-1235/1596434 PCT/JP2004013263 dated on Aug. 27, 2008.

Japanese Notice of Reasons for Rejection, w/ English translation thereof, issued in Japanese Patent Application No. JP 2005-513733 dated Jun. 1, 2010.

* cited by examiner

SEMICONDUCTOR APPARATUS INCLUDING POWER SEMICONDUCTOR DEVICE CONSTRUCTED BY USING WIDE BAND GAP SEMICONDUCTOR

TECHNICAL FIELD

The present invention relates to a MISFET formed by utilizing a compound semiconductor layer, and more particularly, it relates to a MISFET suitably used for a high breakdown voltage and a large current.

BACKGROUND ART

In a power module composed of a plurality of semiconductor chips including a power device, it is conventionally a significant problem to diffuse heat of a semiconductor device generated through power loss of the power device (for example, see Document 1 (Power Electronics Handbook (R & D Planning), edited by Koji Imai (p. 602)). Therefore, a conventional semiconductor apparatus is designed, for cooling a power device and keeping its temperature below the safety operating temperature, to place the power device in contact with the package base material so that heat generated in the power device can be released through a package base material through heat conduction. Accordingly, in the case where a power module is constructed by using a plurality of semiconductor chips, it is necessary to make every semiconductor device in contact with a package base material.

FIG. 11 is a cross-sectional view of a conventional semiconductor power module composed of three Si power devices. As shown in FIG. 11, the conventional semiconductor power module includes a base material 101 provided with a fin 101a on its back face for releasing heat, Si chips 102, 103 and 104 corresponding to the three Si power devices secured on the upper face of the base material 101 through soldering, and bonding wires 105 for electrically connecting the Si chips 102, 103 and 104 to one another. Owing to this structure, heat generated in the Si chips 102, 103 and 104 can be efficiently diffused to the base material 101 through the heat conduction, and therefore, the temperatures of the Si chips 102, 103 and 104 corresponding to the power devices can be suppressed to 150° C. or less, that is, their temperature assurance range.

PROBLEMS TO BE SOLVED BY THE INVENTION

In the conventional semiconductor power module, however, in order to mount the plural Si chips 102, 103 and 104 included in the semiconductor power module respectively on the base material 101, the base material 101 needs to have an area larger than at least the total areas of the Si chips 102, 103 and 104. As a result, the package area of the semiconductor power module used for dealing with a comparatively large current is unavoidably large.

In particular, in the case where the Si chip, that is, a conventional power device, is a MOSFET, an IGBT, a diode or the like, the power module is designed, in consideration of the thermal conductivity of Si of approximately 1.5 W/cmK, so that heat generated by a current flowing to the Si chip during the operation can be efficiently released and that the temperature of a portion having the highest current density in the Si chip cannot exceed 150° C. The semiconductor power device included in the Si chip cannot control current when the temperature exceeds 150° C. because thermal runaway is caused therein to put the device in a short-circuited state at that temperature. For example, when the current density within the semiconductor power device is 10 A/cm$^2$ or more during its operation, it is necessary to provide means for releasing heat generated within the semiconductor power device. In particular, when the current density within the semiconductor power device is 50 A/cm$^2$ or more, the heat generated within the semiconductor power device is remarkably large, and hence, it is necessary to provide an adequate measure to design for releasing the heat.

Since the heat release is significant in the design of a semiconductor power module as described above, a Si chip corresponding to a power device is designed to be definitely in contact with a base material working as a heat releasing path and is directly connected to the base material through soldering or the like by a method designated as die bonding. As a result, the area of a semiconductor apparatus is unavoidably large.

Also, in order to electrically connect a plurality of semiconductor devices arranged on the base material with a large area, long bonding wires are necessary. Therefore, there arises another problem that the electric resistance of the long wires further increases the power loss derived from the electric resistance of the semiconductor apparatus.

Furthermore, in the case where the base material is a lead or a die pad, its end portion corresponds to an external connection terminal to be connected, through soldering or the like, to a mother substrate such as a print wiring board. When the temperature of the external connection terminal becomes too high as a result of a large amount of heat released to the base material, it is apprehended that the reliability of the connection to the mother substrate is degraded because a bonding metal such as the solder is melted or the connection is weakened.

DISCLOSURE OF THE INVENTION

An object of the invention is providing a power semiconductor apparatus capable of allowing a large current to efficiently flow and using a wide band gap semiconductor device with high reliability in connection to a mother substrate.

The first semiconductor apparatus of this invention includes a semiconductor chip including a power semiconductor device using a wide band gap semiconductor; an electrically conductive base material connected to a part of a face of the semiconductor chip and having a tip working as an external connection terminal; a heat conducting member in contact with a part of the face of the semiconductor chip; and an encapsulating material for encapsulating them.

Accordingly, most of heat generated from the semiconductor chip, that is, a source of large heat, is transmitted through the heat conducting member to be released outside the semiconductor apparatus, and the amount of heat transmitted to the external connection terminal is small. Therefore, connection reliability at the connection between a mother substrate and the external connection terminal is never degraded due to temperature increase, and hence, high reliability can be kept while keeping the power semiconductor device at an appropriately high temperature for attaining high efficiency.

When the power semiconductor device has a region where a current passes at a current density of 50 A/cm$^2$ or more, application of the structure of this invention is significant.

When the encapsulating material is made of a resin or glass and the heat conducting member is exposed from the encapsulating material, the function to release the heat is further increased.

When the semiconductor apparatus further includes a radiation fin that is in contact with the heat conducting member and is extruded outside the encapsulating material, the heat releasing property can be further improved.

The semiconductor apparatus may further include a film for covering the encapsulating material. In this case, the semiconductor apparatus preferably further includes a radiation fin opposing the heat conducting member with the film sandwiched therebetween.

When a first intermediate member made of an electrically conductive material and a second intermediate member made of a material having lower heat conductivity than the first intermediate member are provided between the base material and the semiconductor chip, the transmittance of the heat to the base material can be appropriately adjusted.

When a contact area between the semiconductor chip and the base material is smaller than a half of an area of the semiconductor chip, the transmittance of the heat to the base material can be effectively suppressed.

When the power semiconductor device is a vertical element and the semiconductor apparatus further includes another semiconductor chip that is stacked on the semiconductor chip and a part of which is connected to the base material, a semiconductor module can be constructed.

Also in the case where the external connection terminal of the base material is constructed to be mounted on a print wiring board, the connection reliability can be kept by applying the present invention.

When the wide band gap semiconductor is SiC, the semiconductor apparatus can function as a power device with a particularly large output.

The second semiconductor apparatus of this invention includes a semiconductor chip including a power semiconductor device using a wide band gap semiconductor; an electrically conductive base material connected to a part of a face of the semiconductor chip; a heat conducting member in contact with a part of the face of the semiconductor chip; a vessel in contact with the heat conducting member and encapsulating the semiconductor chip, the base material and the heat conducting member; and an external connection terminal electrically connected to the base material and extruded from the vessel.

Accordingly, most of heat generated from the semiconductor chip, that is, a source of large heat, is transmitted through the heat conducting member and the vessel to be released to the outside the semiconductor apparatus, and the amount of heat transmitted to the external connection terminal is small. Therefore, connection reliability at the connection between a mother substrate and the external connection terminal is never degraded due to temperature increase, and hence, high reliability can be kept while keeping the power semiconductor device at an appropriately high temperature for attaining high efficiency.

When a region around the semiconductor chip, the base material and the heat conducting member within the vessel is filled with glass, a resin, an inert gas or a gas reduced in pressure, the environment within the vessel can be kept more satisfactorily and hence high reliability can be exhibited.

The second semiconductor apparatus preferably further includes a radiation fin opposing the heat conducting member with a part of the vessel sandwiched therebetween.

BEST MODE FOR CARRYING OUT THE INVENTION

Embodiment 1

Figure 1:
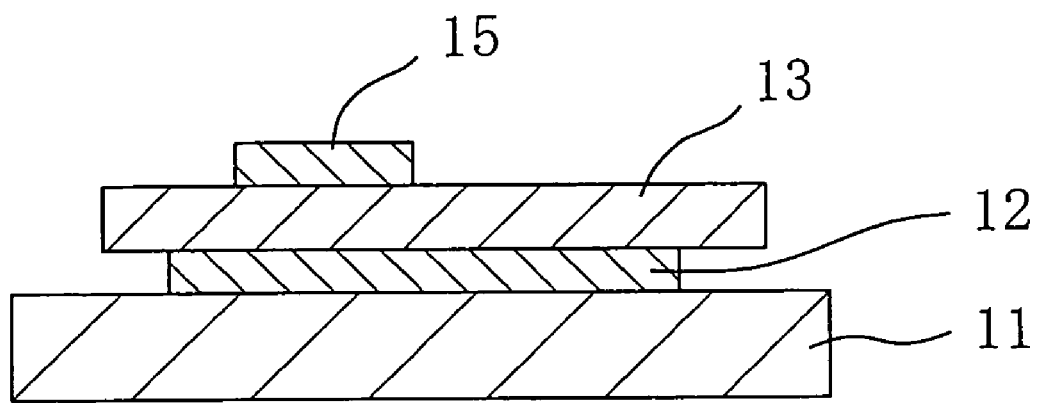
FIG. 1 is a cross-sectional view for showing the structure of a semiconductor apparatus (power module) according to Embodiment 1 of the invention.

FIG. 1 is a cross-sectional view for showing the structure of a semiconductor apparatus (power module) according to Embodiment 1 of the invention.

The semiconductor apparatus (semiconductor power module) according to Embodiment 1 of the invention includes, as shown in FIG. 1, a base material 11 made of a metal material such as Cu and first through third semiconductor chips 12, 13 and 15 (such as a transistor, a diode and an IGBT) different from one another in the size or function and stacked on the base material 11. As characteristics of this semiconductor power module, the semiconductor chips 12, 13 and 15 are stacked with the electrode of at least one semiconductor chip out of the semiconductor chips 12, 13 and 15 connected to the electrode or an active region of another semiconductor chip, and at least one semiconductor chip out of the plural semiconductor chips 12, 13 and 15 includes a semiconductor power device constructed by using a wide band gap semiconductor.

Differently from a semiconductor power module including a conventional Si power device, the semiconductor power module of this embodiment includes a plurality of semiconductor chips at least one of which includes a semiconductor power device using a wide band gap semiconductor, and employs the structure where the semiconductor chips are stacked. Therefore, compactness and area reduction that cannot be attained by the conventional semiconductor power module can be realized.

The "wide band gap semiconductor" herein means a semiconductor with a band gap, that is, an energy difference between the lower end of the conduction band and the upper end of the valence band, of 2.0 eV or more. Examples of such a wide band gap semiconductor are silicon carbide (SiC), a nitride of a group III element such as GaN or AlN, diamond and the like.

In the semiconductor power module of this invention, any of known semiconductor chips can be unboundedly used, and examples of the semiconductor chip are a Schottky diode, a pn diode, a MISFET, a MESFET, a J-FET, a thyrister and the like. Also, one of the plural semiconductor chips may be a passive element such as a capacitive element, an inductive element or a resistance element.

Methods for connecting the semiconductor chips to one another are direct bonding utilizing interdiffusion of metals, bonding through soldering, connection using a bump, connection utilizing an electrically conductive adhesive and the like, any of which may be employed.

Furthermore, any of known packages can be unboundedly used, and examples of the package are a resin-encapsulation package, a ceramic package, a metal package and a glass package. In using any of the packages, a base material made of a metal with comparatively high heat conductivity (such as Cu) is generally used.

In general, the heat conductivity of a wide band gap semiconductor has a value several times as large as that of Si, and silicon carbide (SiC) has heat conductivity of 4.9 W/cmK and diamond has heat conductivity of 20 W/cmK. Owing to such high heat conductivity, in the semiconductor power module including a semiconductor power device using a wide band gap semiconductor, the efficiency in releasing heat generated in the semiconductor power device is comparatively high, and therefore, the temperature increase in a portion with a high current density in the semiconductor power device can be suppressed to be comparatively small. Specifically, in the case where the semiconductor chips 12, 13 and 15 are stacked as shown in FIG. 1, even when the semiconductor chips 12, 13 and 15 are provided at a high density in the semiconductor power module with a small area, the heat generated in the semiconductor power device can be efficiently released to the base material 11. Therefore, a portion with a high current density in the semiconductor power device (such as a source region of a power transistor) can be kept at a comparatively low temperature.

Also, in comparison between MISFETs having equivalent breakdown voltages of 1 kV, the semiconductor power device using the wide band gap semiconductor has power loss smaller by one or more figures than a Si power device. In comparison between a Si IGBT and a MISFET using a wide band gap semiconductor, the semiconductor power device using the wide band gap semiconductor has power loss a half or less of that of the Si power device. Owing to the small power loss property of the semiconductor power device using the wide band gap semiconductor, the heat itself generated within the semiconductor power device is also small in the semiconductor power module of this invention, and therefore, as compared with a semiconductor power module using a conventional Si power device, the internal temperature increase can be more advantageously suppressed.

Furthermore, since a MISFET using a wide band gap semiconductor can attain a high breakdown voltage and small power loss property superior to an IGBT using Si, the high speed operation property of the MISFET can be usefully used for controlling a signal of a high voltage/large current. In other words, switching loss caused when the operation speed of a semiconductor power device is low can be reduced.

In particular, in the case where a current with a current density of 50 A/cm$^2$ or more flows to at least one of the plural semiconductor chips in the semiconductor power module, the effect of this invention is remarkably exhibited. This is for the following reason: In an operation where a current density of 50 A/cm$^2$ or more occurs in the semiconductor chip, the heat generated in accordance with the power loss is increased in a Si power device (such as a MISFET), and therefore, it is difficult to continue the operation within the bound of the temperature of 150° C. or less necessary for keeping a normal operation of the Si power device. On the contrary, in the semiconductor power module of this invention, the amount of generated heat is suppressed even when the current density exceeds 50 A/cm$^2$, and hence, the operation can be satisfactorily performed.

Furthermore, even when the temperature of the semiconductor power device using the wide band gap semiconductor (such as SiC) is increased to be 200° C. or more (or further to be 400° C. or more), the semiconductor power module can be satisfactorily operated. Rather, the electric resistance of the semiconductor power device is reduced as the temperature increases, and therefore, the semiconductor power module is found to be able to be more efficiently operated owing to the reduced electric resistance in the case where it is operated with a current density of 50 A/cm$^2$ or more and is kept at a high temperature than in the case where it is kept at a low temperature.

Figure 11:
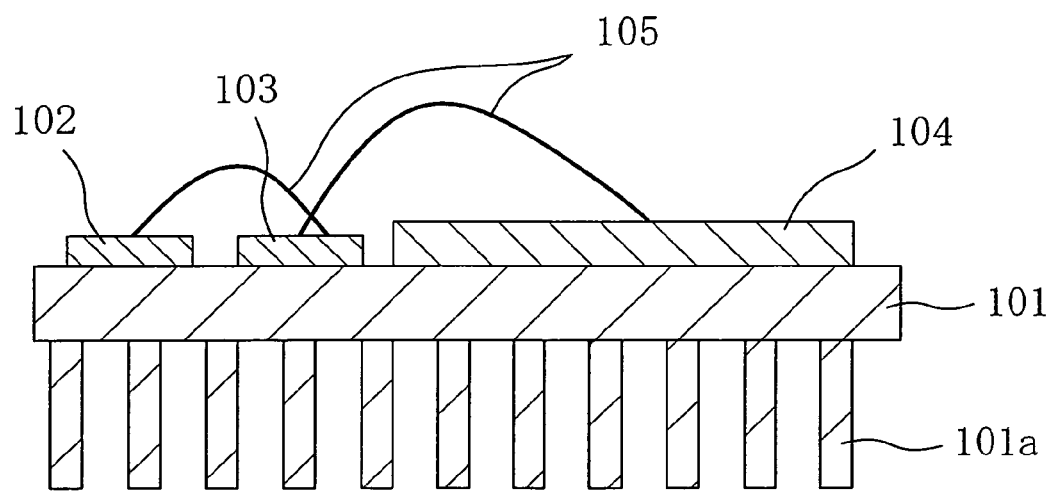
FIG. 11 is a cross-sectional view of a conventional semiconductor apparatus.

In other words, in the semiconductor power module of this invention, since a plurality of semiconductor chips including at least one semiconductor power device using a wide band gap semiconductor are stacked, the operation efficiency is rather increased when the internal temperature is increased as compared with a conventional semiconductor power module in which semiconductor chips are not stacked as shown in FIG. 11.

Furthermore, as shown in FIG. 1, the second semiconductor chip 13 stacked on the first semiconductor chip 12 is preferably larger than the first semiconductor chip 12 in contact with the base material 11 of the semiconductor apparatus. This is because, when the first semiconductor chip 12 corresponding to a heat releasing path to the base material 11 is smaller, the amount of heat released from the second semiconductor chip 13 to the base material 11 is small, and hence, the second semiconductor chip 13 is operated at a higher temperature, resulting in attaining the aforementioned effect to improve the operation efficiency due to the low-loss operation.

Moreover, the plural semiconductor chips 12, 13 and 15 are preferably stacked in three or more layers. This is because the heat generated in a semiconductor chip disposed on the uppermost layer of three or more stacked layers is less released as described above, and therefore, the aforementioned effect to improve the operation efficiency owing to the temperature increase of the semiconductor chip can be more remarkably attained.

Also, the semiconductor chip using the wide band gap semiconductor is preferably a vertical element whose main current flows between the upper face and the lower face of the substrate (such as a vertical MISFET, a vertical diode (a Schottky diode, a pn diode or a pin diode) or a vertical IGBT). This is because a vertical element is particularly suitable to the stacked structure because the current flows between the upper face and the lower face of the substrate.

Furthermore, in the semiconductor power module, the wide band gap semiconductor is preferably silicon carbide (SiC). As semiconductor materials for providing a semiconductor chip capable of operating as a power device even at a high temperature, silicon carbide (SiC), a nitride of a group III element such as GaN or AlN, and diamond are suitable as described above, and it has been confirmed that SiC (a 4H—SiC substrate in particular) is particularly good at the low-loss property, stability, reliability and the like. This is because wafers with a low defect density are supplied, and hence, there minimally arises a problem of dielectric breakdown or the like derived from a defect caused in the crystal.

Example 1

Figure 2A:
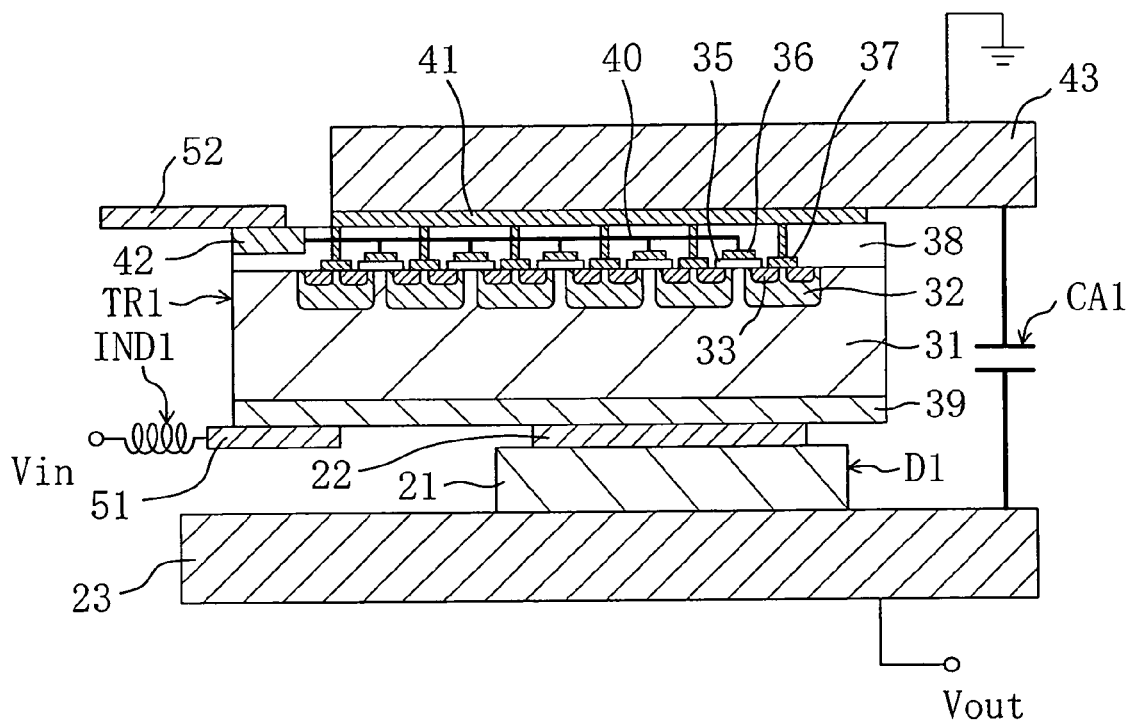
FIGS. 2A and 2B are respectively a cross-sectional view and an electric circuit diagram of a semiconductor apparatus according to Example 1 of Embodiment 1.
Figure 2B:
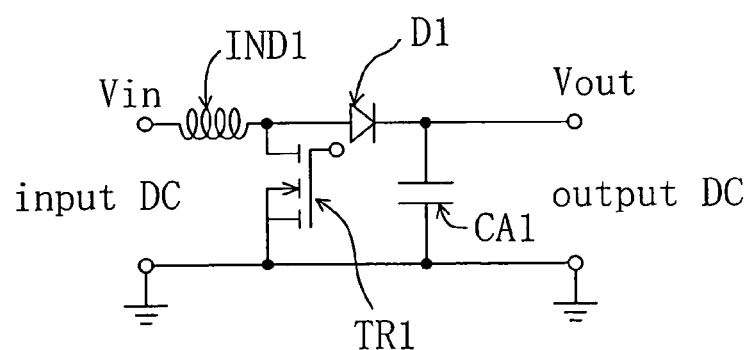

FIGS. 2A and 2B are respectively a cross-sectional view and an electric circuit diagram of a semiconductor apparatus according to Example 1 of Embodiment 1.

As shown in FIG. 2B, the semiconductor apparatus (semiconductor power module) of this example functions as a boosting type DC-DC converter for boosting an input DC signal (input DC) and outputting an output DC signal (output DC). The semiconductor power module includes an inductive element IND1, a power transistor TR1, that is, a vertical MISFET, a Schottky diode D1 and a capacitive element CA1.

As shown in FIG. 2A, the Schottky diode D1 includes an N-type drift layer 21 (active region) occupying most of a SiC substrate made of a wide band gap semiconductor, and a Schottky electrode 22 made of Ni in Schottky contact with the N-type drift layer 21. The N-type drift layer 21 is connected to a base material 23 made of a metal such as Cu, and the base material 23 is connected to an output terminal for outputting an output voltage Vout.

On the other hand, the power transistor TR1 includes an n-type drift layer 31 (active region) occupying most of a SiC substrate made of a wide band gap semiconductor; a P-type base layer 32 formed in the N-type drift layer 31 by doping it with a P-type impurity; an $N^+$-type source layer 33 formed in the P-type base layer 32 by doping it with a high concentration N-type impurity; a gate insulating film 35 of a silicon oxide film formed in a surface portion of the SiC substrate over the P-type base layer 32, the N-type drift layer 31 and the $N^+$-type source layers 33 sandwiching the P-type base layer 32; a gate electrode 36 made of a metal such as Al or polysilicon and provided on the gate insulating film 35; a source electrode 37 formed in a surface portion of the SiC substrate over the $N^+$-type source layers 33 sandwiching the P-type base layer 32; an interlayer insulating film 38 of a silicon oxide film provided on the SiC substrate; a gate interconnect/plug 40 made of a metal such as Al and penetrating the interlayer insulating film 38 so as to be connected to the gate electrode 36; a leading electrode 42 of the gate interconnect/plug 40; and a source interconnect/plug 41 made of a metal such as Al and penetrating the interlayer insulating film 38 to be connected to every source electrode 37. A portion of the source interconnect/plug 41 positioned on the upper face of the interlayer insulating film 38 is provided in the shape of a plate, this portion is connected to a base material 43 made of a metal such as Cu, and the base material 43 is connected to the ground. Also, a back electrode 39 made of a metal such as Ni or Ni silicide alloy is provided on the lower face of the N-type drift layer 31, and the back electrode 39 is connected to the Schottky electrode 22 of the Schottky diode D1.

Furthermore, the leading electrode 42 is connected to an interconnect 52, and the interconnect 52 is connected to a gate voltage control driver. The back electrode 39 is connected to an interconnect 51, and the interconnect 51 is connected to an input terminal for receiving an input voltage Vin through the inductive element IND1 corresponding to a chip inductor. Also, the capacitive element CA1 corresponding to a chip capacitor is sandwiched between the base material 23 and the base material 43.

Next, fabrication procedures for the semiconductor power module of this example will be described.

First, the N-type drift layer 21 of the Schottky diode D1, that is, a comparatively small semiconductor power device, is bonded on the upper face of the base material 23 by, for example, soldering. At this point, bonding is performed by using AuSn solder or SnAgCu solder at 300° C.

Next, the power transistor TR1, that is, a comparatively large semiconductor chip, is bonded on the upper face of the Schottky electrode 22 of the Schottky diode D1. The bonding between the Schottky diode D1 and the power transistor TR1 may be performed by soldering, but in this example, the Schottky electrode 22 of the Schottky diode D1 and the back electrode 39 of the power transistor TR1 are pushed against each other so as to bond them by utilizing interdiffusion of the metal. In this bonding, weighting of 0.1 through 1 kg/cm$^2$ and ultrasonic of 60 through 120 kHz are applied.

Furthermore, the base material 43 is mounted on the upper face of the source interconnect/plug 41 of the power transistor TR1 by using solder for bonding them to each other. In this case, a gold plate bump may be provided on the upper face of the source interconnect/plug 41 for ultrasonic bonding to the base material 43. The interconnects 51 and 52 are respectively connected to the back electrode 39 and the leading electrode 42 of the power transistor TR1, the inductive element IND1 corresponding to the chip inductor is connected to the interconnect 51 and the capacitive element CA1 corresponding to the chip capacitor is connected between the base materials 23 and 43. Thereafter, the Schottky diode D1, the power transistor TR1, the capacitive element CA1, the inductive element IND1, the capacitive element CA1 and the interconnects 51 and 52 are assembled as one package by resin-encapsulation. The method for the resin-encapsulation is not shown in the drawing but any of various known resin-encapsulation techniques can be employed. At this point, the inductive element IND1 corresponding to the chip inductor and the capacitive element CA1 corresponding to the chip capacitor may be externally provided without being integrated within the package.

In the conventional semiconductor power module, the semiconductor chips 103 and 104 are both connected to the upper face of the base material 101. In the semiconductor power module of this example, however, the power transistor TR1 is stacked on the Schottky diode D1 corresponding to a semiconductor chip, and therefore, the area occupied by the semiconductor power module is reduced.

Also, a power module having the same structure as the semiconductor power module of this example is constructed by using a pn diode and a power transistor using Si, so as to be compared with the power module of this example. Assuming that the power transistor TR1 is a chip 3 mm square, the junction temperature exceeds 150° C. with rating of a current of 5 A in the conventional semiconductor power module using the Si chip, but in the semiconductor power module of this example, a current of 10 A or more can be allowed to flow, and it is confirmed that the semiconductor power module is stably operated even when a current flows to the $N^+$-type source region 33 of the power transistor TR1 at a current density of 50 A/cm$^2$ or more. At this point, the junction temperature of the power transistor TR1 and the Schottky diode D1 of this example is kept at 150° C. or less.

Furthermore, it is confirmed that the semiconductor power module of this example is stably operated even when a current of 20 A is allowed to flow. In this case, as compared with the case where a current of 10 A is allowed to flow, although the junction temperature of the Schottky diode D1 and the power transistor TR1 is increased beyond 150° C., it is also confirmed that the loss factor is reduced by increasing the current because the electric resistance of the power transistor TR1 is reduced.

Example 2

Figure 3A:
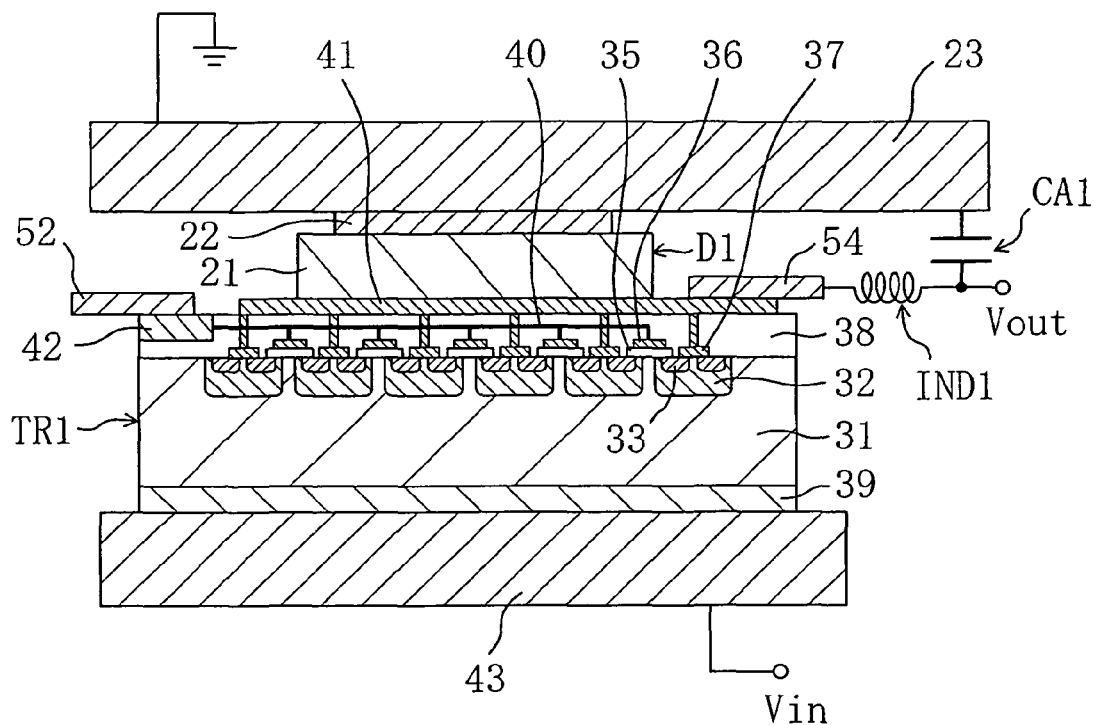
FIGS. 3A and 3B are respectively a cross-sectional view and an electric circuit diagram of a semiconductor apparatus according to Example 2 of Embodiment 1.
Figure 3B:
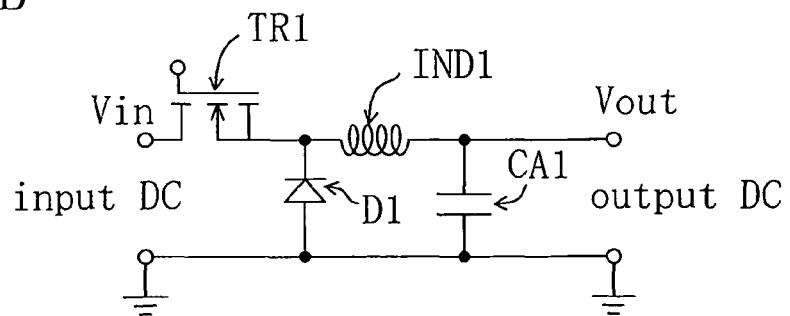

FIGS. 3A and 3B are respectively a cross-sectional view and an electric circuit diagram of a semiconductor apparatus according to Example 2 of Embodiment 1.

As shown in FIG. 3B, the semiconductor apparatus (semiconductor power module) of this example functions as a bucking DC-DC converter for bucking an input DC signal (input DC) and outputting an output DC signal (output DC). The semiconductor power module includes an inductive element IND1, a power transistor TR1, that is, a vertical MISFET, a Schottky diode D1 and a capacitive element CA1.

As shown in FIG. 3A, the Schottky diode D1 has the same structure as the Schottky diode D1 of Example 1. A Schottky electrode 22 is connected to a base material 23 made of Cu and the base material 23 is connected to an output terminal through the capacitive element CA1.

The power transistor TR1 also has the same structure as the power transistor TR1 of Example 1. A portion of a source interconnect/plug 41 positioned on the upper face of an interlayer insulating film 38 is bonded to an N-type drift layer 21 of the Schottky diode D1. Also, a back electrode 39 is bonded to a base material 43 made of a metal such as Cu, and the base material 43 is connected to an input terminal for receiving an input voltage Vin.

Furthermore, a leading electrode 42 is connected to an interconnect 52, and the interconnect 52 is connected to a gate voltage control driver. Also, a portion of the source interconnect/plug 41 positioned on the upper face of the interlayer insulating film 38 is connected to an interconnect 54, and the interconnect 54 is connected to an output terminal for outputting an output voltage Vout through the inductive element IND1 corresponding to a chip inductor.

Fabrication procedures for the semiconductor power module of this example are basically the same as those described in Example 1 and hence the description is omitted.

Example 3

Figure 4A:
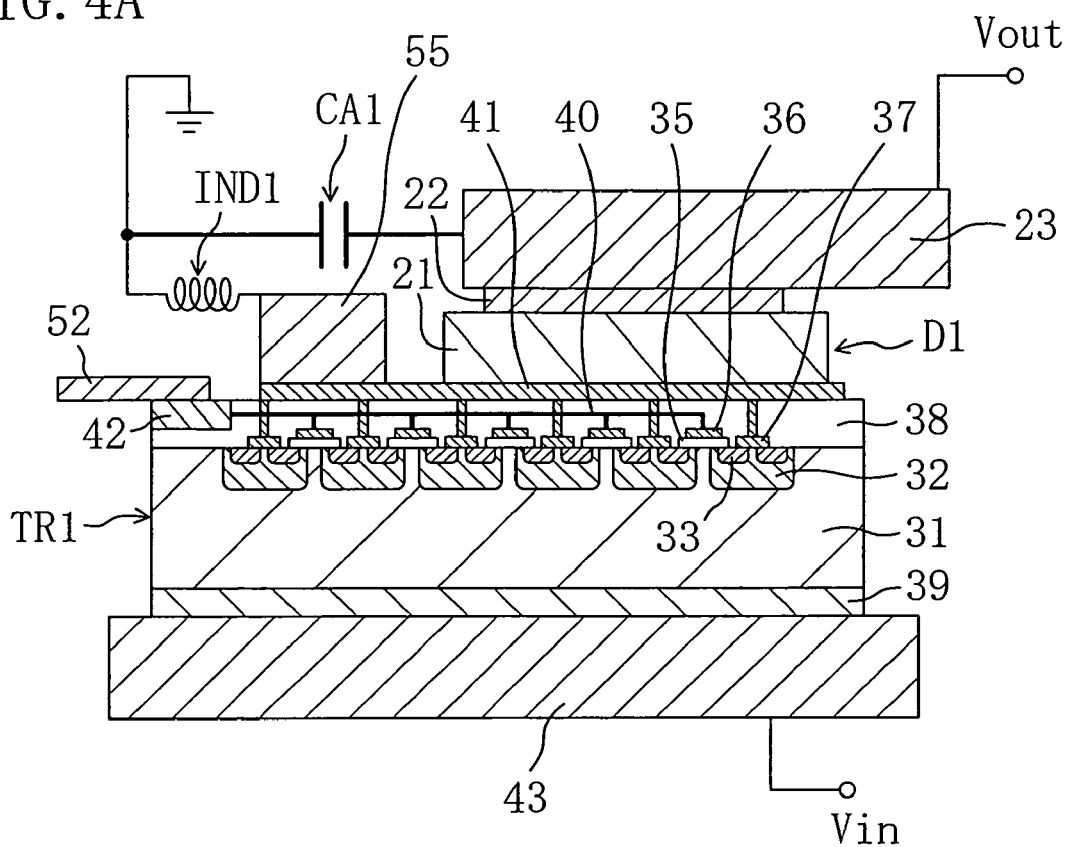
FIGS. 4A and 4B are respectively a cross-sectional view and an electric circuit diagram of a semiconductor apparatus according to Example 3 of Embodiment 1.
Figure 4B:
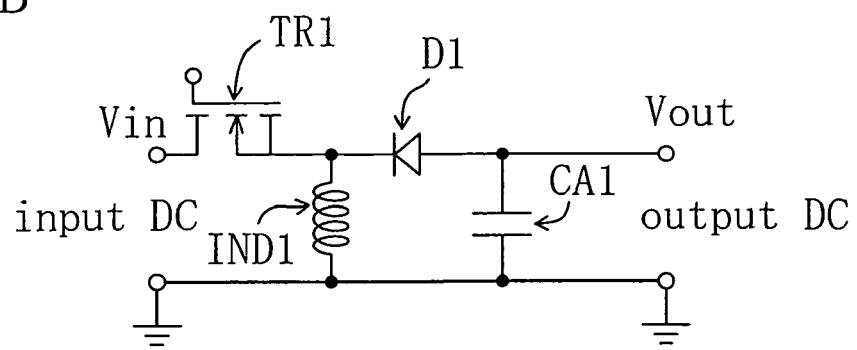

FIGS. 4A and 4B are respectively a cross-sectional view and an electric circuit diagram of a semiconductor apparatus according to Example 3 of Embodiment 1.

As shown in FIG. 4B, the semiconductor apparatus (semiconductor power module) of this example functions as an inverting DC-DC converter for inverting an input DC signal with a positive voltage (input DC) and outputting an output DC signal with a negative voltage (output DC). The semiconductor power module includes an inductive element IND1, a power transistor TR1, that is, a vertical MISFET, a Schottky diode D1 and a capacitive element CA1.

As shown in FIG. 4A, the Schottky diode D1 has the same structure as the Schottky diode D1 of Example 1. A Schottky electrode 22 is connected to a base material 23 made of a metal such as Cu, and one end of the base material 23 is connected to an output terminal with the other end thereof connected to the ground through the capacitive element CA1.

The power transistor TR1 also has the same structure as the power transistor TR1 of Example 1. A portion of a source interconnect/plug 41 positioned on the upper face of an interlayer insulating film 38 is bonded to an N-type drift layer 21 of the Schottky diode D1. Also, a back electrode 39 is connected to a base material 43 made of a metal such as Cu, and the base material 43 is connected to an input terminal for receiving a positive input voltage Vin.

Furthermore, a leading electrode 42 is connected to an interconnect 52, and the interconnect 52 is connected to a gate voltage control driver. Also, the portion of the source interconnect/plug 41 positioned on the upper face of the interlayer insulating film 38 is connected to an interconnect 55, and the interconnect 55 is connected to the ground through the inductive element IND1 corresponding to a chip inductor.

Fabrication procedures for the semiconductor power module of this example are basically the same as those described in Example 1 and hence the description is omitted.

Embodiment 2

Figure 5A:
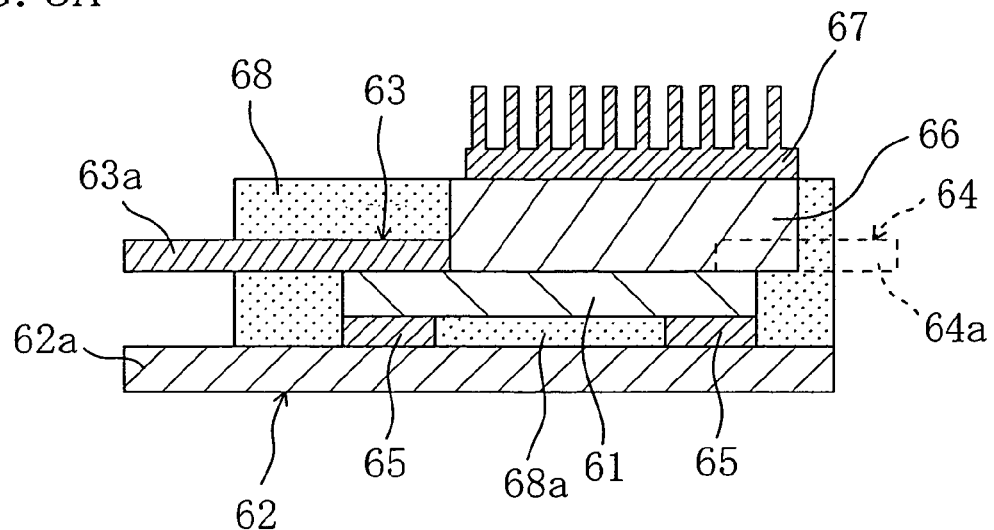
FIGS. 5A and 5B are cross-sectional views for showing two exemplified structures of a semiconductor apparatus according to Embodiment 2 of the invention.
Figure 5B:
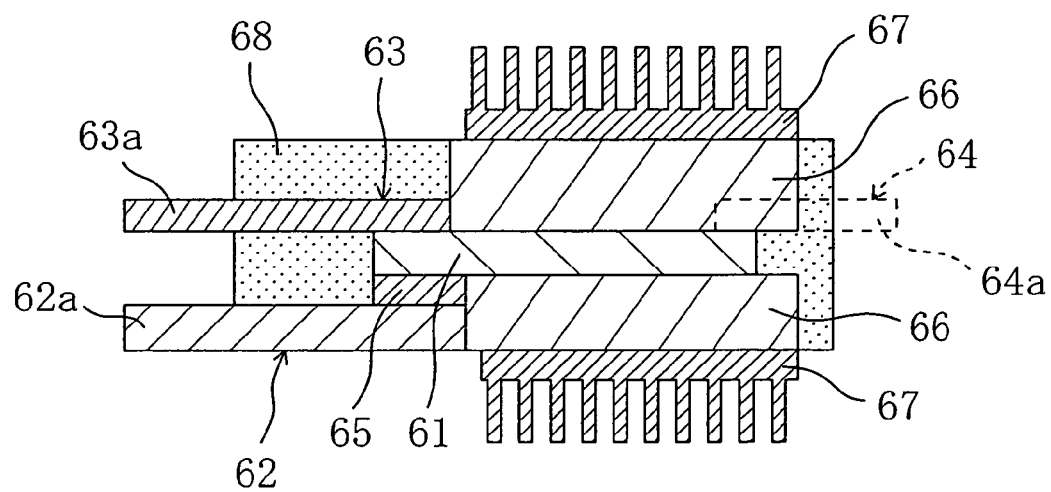

FIGS. 5A and 5B are cross-sectional views for showing two exemplified structures of a semiconductor apparatus according to Embodiment 2 of the invention.

In the first exemplified structure, as shown in FIG. 5A, the semiconductor apparatus according to Embodiment 2 of the invention includes a semiconductor chip 61 containing a power semiconductor device using a wide band gap semiconductor; a base material 62 corresponding to a die pad made of an electrically conductive metal material such as Cu; a base material 63 corresponding to a lead made of a metal material such Cu and connected to a pad electrode (not shown) of the semiconductor chip 61; a first intermediate member 65 and a second intermediate member 68a disposed between the semiconductor chip 61 and the base material 62 and in contact with a part of the semiconductor chip 61; a heat conducting member 66 in contact with the semiconductor chip 61 and made of a material with high heat conductivity (such as a metal or ceramic); a radiation fin 67 provided on the heat conducting member 66; and an encapsulating material 68 for encapsulating the semiconductor chip 61, the first and second intermediate members 65 and 68a and the heat conducting member 66. Respective tips of the base materials 62 and 63 are extruded outside the encapsulating material 63, so as to work as external connection terminals 62a and 63a for use in mounting the semiconductor apparatus on a print wiring board or the like.

In this embodiment, the material of the semiconductor chip 61 including the power semiconductor device using the wide gap semiconductor, the types of transistor and diode, and the like are the same as those described in Embodiment 1.

The second intermediate member 68a is made of a material with lower heat conductivity than the first intermediate member 65, and the contact area with the semiconductor chip 61 is larger in the second intermediate member 68a than in the first intermediate member. For example, the first intermediate member 65 is made of copper with heat conductivity of 4 (W/cm·deg) and the second intermediate member 68a is made of a material with heat conductivity lower than 0.1 (W/cm·deg). In the exemplified structure shown in FIG. 5A, the second intermediate member 68a is a part of the encapsulating material 68. The heat conducting member 66 is made of, for example, alumina (ceramic) with heat conductivity of 0.26 (W/cm·deg). The radiation fin 67 may be made of the same material as the heat conducting member 66 or made of a metal such as copper alloy. Alternatively, the radiation fin 67 may be a cooling medium with large heat capacity.

Also, in the second exemplified structure, as shown in FIG. 5B, heat conducting members 66 in contact with respective faces of the semiconductor chip 61 are provided. A radiation fin 67 is provided on the face of each heat conducting member 66.

In the case where, for example, the power semiconductor device included in the semiconductor chip 61 is a three-terminal type element (such as a MISFET) in either of the first and second exemplified structures as shown with broken lines in FIGS. 5A and 5B, it is necessary to provide a base material 64 corresponding to another lead connected to an electrode of the semiconductor chip 61.

As a characteristic of the semiconductor apparatus of this embodiment, the heat conducting member 66 in contact with the semiconductor chip 61 corresponding to the power device is provided so as to be exposed from the encapsulating material 68. Also, the base member 62 is connected to merely a part of the semiconductor chip 61 through the first intermediate member 65 and is not in contact with the whole face of the semiconductor chip 61 differently from the conventional semiconductor power module.

According to this embodiment, since the heat conducting member 66 in contact with the semiconductor chip 61 is provided so as to be exposed from the encapsulating material 68, heat generated within the semiconductor chip 61 including the power semiconductor device is released through the heat conducting member 66, and the temperatures of the external connection terminals 62a and 63a are prevented from being excessively increased by the heat of the semiconductor chip 61, and in addition, the semiconductor chip 61 can be kept at an appropriately high temperature and in a state where high operation efficiency is attained. Accordingly, the connection between the external connection terminals 62a and 63a and a mother substrate such as a print wiring board can be improved. Also, compactness and area reduction can be realized owing to the improvement of the heat releasing property.

In particular, since the base material 62 is connected not to the whole face of the semiconductor chip 61 but to an area of ½ or less of the upper or lower face directly or with the conducting member sandwiched therebetween, the temperature increase of the external connection terminal 62a corresponding to the tip of the base member 62 can be advantageously more effectively suppressed.

Also when a mold resin with high heat resistance is used as the encapsulating material without providing the heat conducting member 66 and the radiation fin 67, the excessive temperature increase of the external connection terminals 62a and 63a can be suppressed while appropriately keeping the temperature of the semiconductor chip 61 for keeping the high operation efficiency.

Alternatively, an encapsulating glass may be used as the encapsulating material instead of the encapsulating resin, and a film covering the encapsulating resin or encapsulating glass may be provided. In this case, the radiation fin is provided in a position opposing the heat conducting member with the encapsulating resin or encapsulating glass sandwiched therebetween.

Also, a chip including a semiconductor device such as a diode may be provided between the heat conducting member 66 and the semiconductor chip 61, or a chip including a semiconductor device such as a diode may be provided instead of the second intermediate member 68a. In this case, a power module is obtained as in Embodiment 1.

In the semiconductor apparatus of this embodiment, any of known semiconductor chips can be unboundedly used, and for example, a semiconductor chip mounting a Schottky diode, a pn diode, a MISFET, a MESFET, a J-FET, a thyristor or the like may be used.

Methods for connecting the pad electrode of the semiconductor chip and the base material to each other are direct bonding utilizing interdiffusion of metals, bonding through soldering, connection using a bump, connection utilizing an electrically conductive adhesive and the like, any of which may be employed.

Furthermore, any of known packages can be unboundedly used, and examples of the package are a resin-encapsulation package, a ceramic package, a metal package and a glass package. In using any of the packages, a base material made of a metal with comparatively high heat conductivity (such as Cu) is generally used.

Also, in comparison between MISFETs having equivalent breakdown voltages of 1 kV, the semiconductor power device using the wide band gap semiconductor has power loss smaller by one or more figures than a Si power device. In comparison between a Si IGBT and a MISFET using a wide band gap semiconductor, the semiconductor power device using the wide band gap semiconductor has power loss a half or less of that of the Si power device. Owing to the small power loss property of the semiconductor power device using the wide band gap semiconductor, the heat itself generated within the semiconductor power device is also small in the semiconductor power device of this invention, and therefore, as compared with a semiconductor power device using a conventional Si power device, the internal temperature increase can be more advantageously suppressed.

Furthermore, since a MISFET using a wide band gap semiconductor can attain a high breakdown voltage and small power loss property superior to an IGBT using Si, the high speed operation property of the MISFET can be usefully used for controlling a signal of a high voltage/large current. In other words, switching loss caused when the operation speed of a semiconductor power device is low can be reduced.

In particular, in the case where a current with a current density of 50 A/cm$^2$ or more flows to at least one of a plurality of semiconductor devices in the semiconductor power module, the effect of this invention is remarkably exhibited. This is for the following reason: In an operation where a current density of 50 A/cm$^2$ or more occurs in the semiconductor device, the heat generated in accordance with the power loss is increased in a Si power device (such as a MISFET), and therefore, it is difficult to continue the operation within the bound of the temperature of 150° C. or less necessary for keeping a normal operation of the Si power device. On the contrary, in the semiconductor power device of this invention, the amount of generated heat is suppressed even when the current density exceeds 50 A/cm$^2$, and hence, the operation can be satisfactorily performed.

Furthermore, even when the temperature of the semiconductor power device using the wide band gap semiconductor (such as SiC) is increased to be 200° C. or more (or further to be 400° C. or more), the semiconductor power module can be satisfactorily operated. Rather, the electric resistance of the semiconductor power device is reduced as the temperature increases, and therefore, the semiconductor power module is found to be able to be more efficiently operated owing to the reduced electric resistance in the case where it is operated with a current density of 50 A/cm$^2$ or more and is kept at a high temperature than in the case where it is kept at a low temperature.

Next, the reason why the temperature increase of the external connection terminal corresponding to the tip of the base material can be suppressed so as to keep high reliability in the connection with a mother substrate by setting the contact area between the base material and the upper or lower face of the semiconductor chip to be smaller than ½ of the upper or lower face will be described.

Conventionally, the heat resistance from a Si semiconductor device to a base material is designed so that the temperature of the semiconductor device can be 150° C. when the temperature of the base material is 90° C., namely, a temperature difference therebetween can be 60° C., in the case where normal rated power is given to the semiconductor device. In other words, a current corresponding to heat generation to increase the temperature of the Si semiconductor device to 150° C. can be allowed to flow. Similarly, in the case where a SiC (silicon carbide) power device is mounted, it is necessary to set the temperature of the SiC semiconductor apparatus to 200° C. and the temperature of the base material to 90° C. in the same manner as in the Si semiconductor device unless the package is largely modified. The temperature difference in the SiC semiconductor apparatus is 110° C., which is substantially twice as large as that in the Si semiconductor apparatus. Accordingly, the aforementioned temperature range can be attained if the heat resistance between the SiC chip including the SiC semiconductor device (corresponding to the semiconductor chip 61 of this embodiment) and the base material is set to be twice as large as that set in the Si chip including the Si semiconductor device. In order to realize this, when the contact area on the upper or lower face (front or back face) of the SiC chip is a half of the upper or lower face, the heat resistance is doubled, which means that the SiC semiconductor device can be normally operated at 200° C. with the temperature of the base material kept at 90° C. or less. When another radiation mechanism (base material) with high heat conductivity is additionally provided, the temperature increase of the base material can be suppressed while suppressing the temperature increase of the SiC semiconductor device by further reducing the contact area. In other words, when the contact area with the base material on the upper or lower face of the SiC chip is a half or less of the upper or lower face, a stable operation can be performed without causing the temperature increase. At this point, when the heat resistance of the package itself is changed to 200° C. or more by largely modifying the package resin or the like to a metal or the like, the half contact area should be further reduced.

On the contrary, when the contact area between the SiC chip and the base material is a half or more of the upper or lower face (front or back face) of the SiC chip, in the case where a current is allowed to flow with the temperature of the SiC semiconductor device set to 200° C. corresponding to the heat resistant temperature of the package, the temperature of the base material exceeds 90° C., and hence, there arises a problem derived from the heat generation in a contact portion between the base material and a print wiring board or the like.

Example 1

Figure 6:
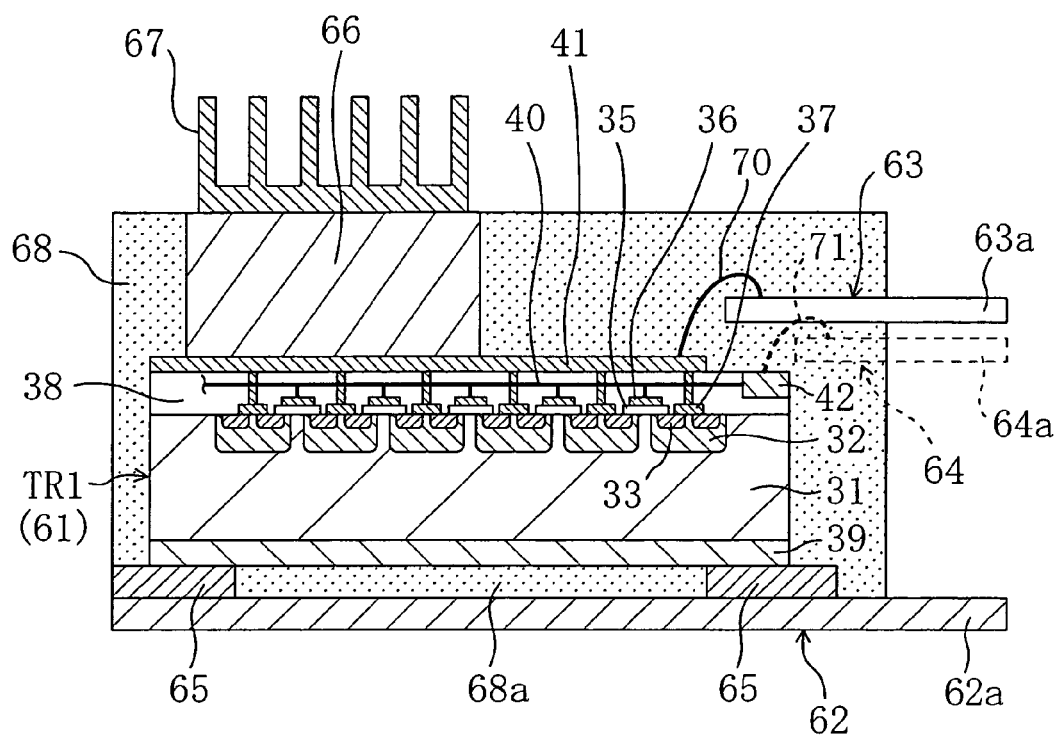
FIG. 6 is a cross-sectional view of a semiconductor apparatus according to Example 1 of Embodiment 2.

FIG. 6 is a cross-sectional view of a semiconductor apparatus according to Example 1 of Embodiment 2. As shown in FIG. 6, the semiconductor apparatus of this example includes a power transistor TR1, that is, a vertical MISFET.

As shown in FIG. 6, the power transistor TR1 (a semiconductor chip 61) includes an N-type drift layer 31 (active region) occupying most of a SiC substrate made of a wide band gap semiconductor; a P-type base layer 32 formed in the N-type drift layer 31 by doping it with a P-type impurity; an $N^+$-type source layer 33 formed in the P-type base layer 32 by doping it with a high concentration N-type impurity; a gate insulating film 35 of a silicon oxide film formed in a surface portion of the SiC substrate over the P-type base layer 32, the N-type drift layer 31 and the $N^+$-type source layers 33 sandwiching the P-type base layer 32; a gate electrode 36 of a metal such as Al or polysilicon provided on the gate insulating film 35; a source electrode 37 formed in a surface portion of the SiC substrate over the $N^+$-type source layers 33 sandwiching the P-type base layer 32; an interlayer insulating film 38 of a silicon oxide film provided on the SiC substrate; a gate interconnect/plug 40 made of a metal such as Al and penetrating the interlayer insulating film 38 to be connected to the gate electrode 36; a leading electrode 42 of the gate interconnect/plug 40; and a source interconnect/plug 41 made of a metal such as Al and penetrating the interlayer insulating film 38 to be connected to every source electrode 37.

A portion of the source interconnect/plug 41 positioned on the upper face of the interlayer insulating film 38 is provided in the shape of a plate, this portion is connected to a base material 63 (lead) made of a metal such as Cu through a metal fine line 70, and the tip of the base material 63 works as an external connection terminal 63a to be connected to an output terminal portion of a mother substrate.

Also, a back electrode 39 made of a metal such as Ni or Ni silicide alloy is provided on the lower face of the N-type drift layer 31, the back electrode 39 is connected to a base material 62 (die pad) through a first intermediate member 65, and the tip of the base material 62 works as an external connection terminal 62a to be connected to the ground of the mother substrate.

Furthermore, the leading electrode 42 is connected to a base material 64 (lead) provided on a cross-section not shown through a metal fine line 71, and the tip of the base material 64 works as an external connection terminal 64a to be connected to a gate bias supplying part of the mother substrate.

Furthermore, a heat conducting member 66 made of alumina (ceramic) is provided on the upper face of the power transistor TR1, and a radiation fin 67 made of a copper alloy plate is provided on the upper face of the heat conducting member 66.

On the upper side of the substrate 62, the power transistor TR1, the first intermediate member 65, the base materials 63 and 64, the metal fine lines 70 and 71 and the heat conducting member 66 are encapsulated with an encapsulating material 68 made of epoxy resin. A portion of the encapsulating material 68 sandwiched between the power transistor TR1 and the base material 62 works as a second intermediate member 68a.

Figure 7A:
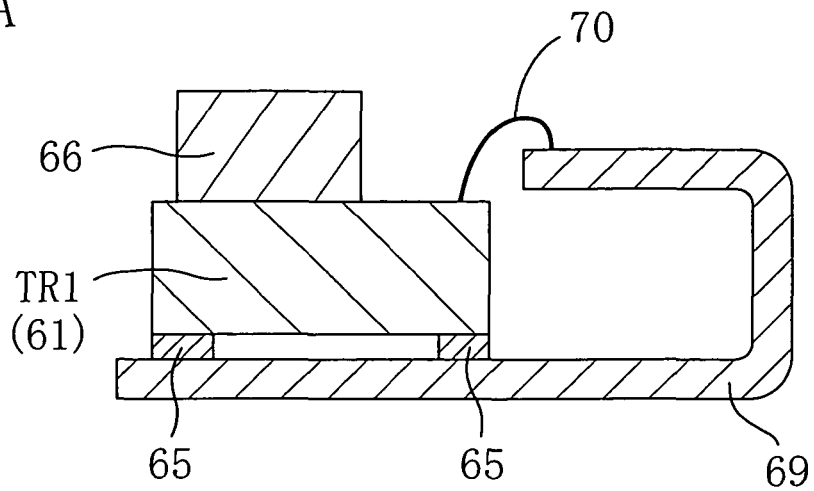
FIGS. 7A through 7C are cross-sectional views for showing fabrication procedures for the semiconductor apparatus of Example 1 of Embodiment 2.
Figure 7B:
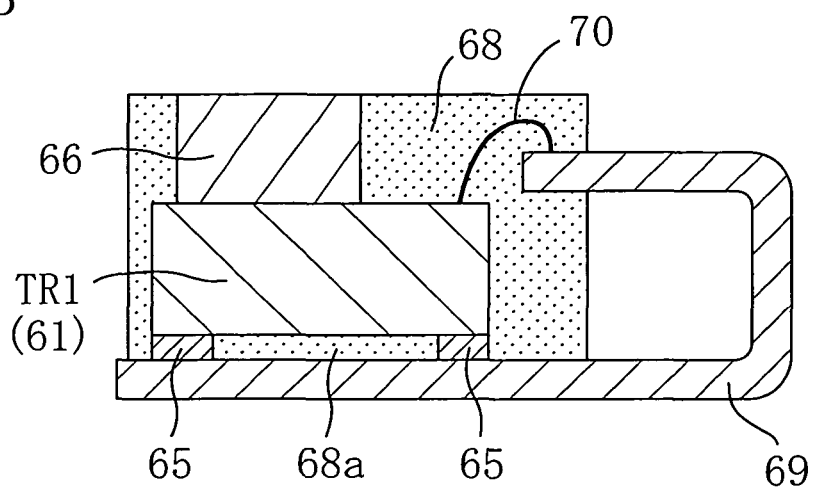
Figure 7C:
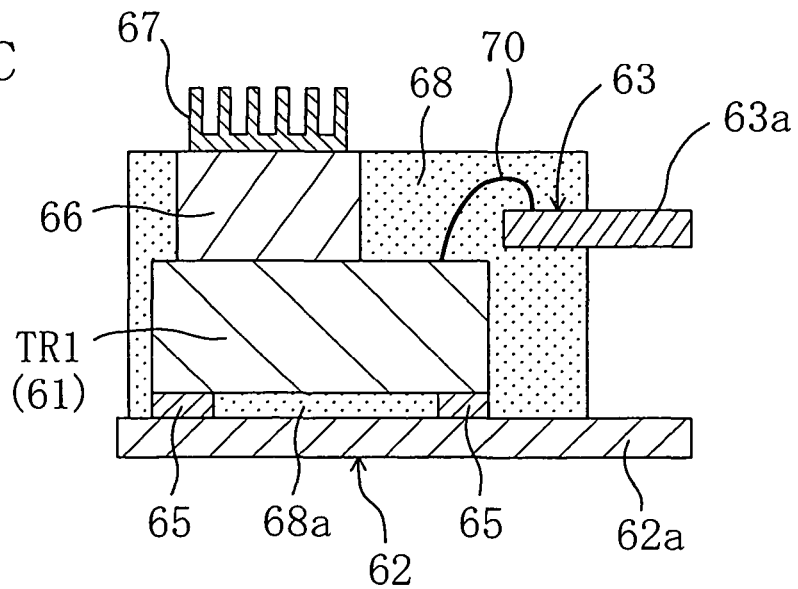

Next, a method for fabricating the semiconductor apparatus of this example will be described. FIGS. 7A through 7C are cross-sectional views for showing fabrication procedures for the semiconductor apparatus of this example.

First, in a step shown in FIG. 7A, the power transistor TR1 (semiconductor chip 62) is mounted, with the first intermediate member 65 sandwiched therebetween, on a lead frame 69 having a lead bended in a U-shape from a plate part thereof, and the source interconnect/plug 41 (not shown) and the lead of the lead frame 69 are connected to each other through the metal fine line 70. Also, the heat conducting member 66 made of alumina is mounted on the upper face of the power transistor TR1.

Next, in a step shown in FIG. 7B, the power transistor TR1, a part of the lead frame 69, the first intermediate member 65 and the metal fine line 70 are encapsulated with the encapsulating material 68 made of epoxy resin. At this point, the upper face (top face) of the heat conducting member 66 is exposed from the encapsulating material 68.

Then, in a step shown in FIG. 7C, the lead frame 69 is cut, so that portions thereof to be used as the base material 62 including the external connection terminal 62a and as the base material 63 including the external connection terminal 63a can remain. Also, the radiation fin 67 made of Cu or the like is provided on the upper face of the heat conducting member 66. Through these steps, the structure of the semiconductor apparatus shown in FIG. 6 is obtained.

Although the base material 64 present on the cross-section not shown and the leading electrode are connected to each other through the metal fine line 71 as shown in FIG. 6, the corresponding portion is not shown in FIGS. 7A through 7C.

Figure 8:
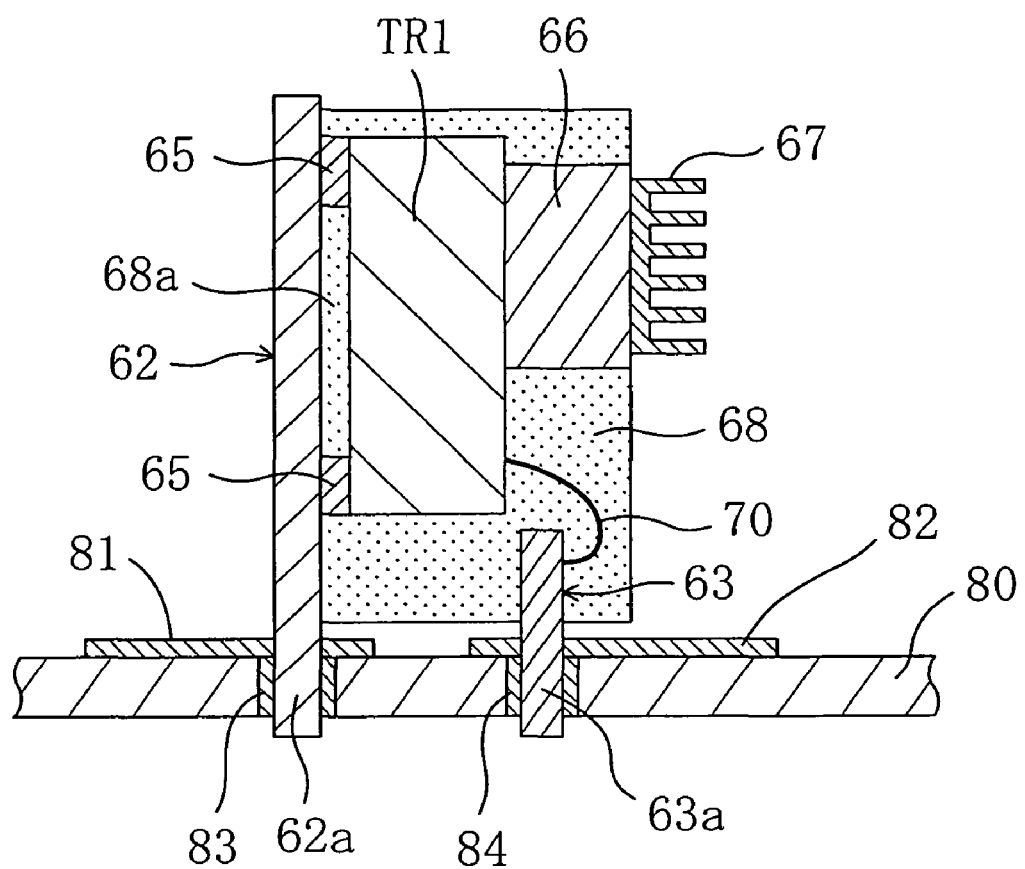
FIG. 8 is a cross-sectional view for showing exemplified mounting of a power transistor TR1 on a print wiring board.

FIG. 8 is a cross-sectional view of exemplified mounting of the power transistor TR1 on a print wiring board. As shown in this drawing, in the print wiring board 80, a ground line 81, a through hole 83 having an electrically conductive layer connected to the ground line 81, a source voltage supplying line 82 and a through hole 84 having an electrically conductive layer connected to the source voltage supplying line 82 are formed. The external connection terminal 62*a* of the semiconductor apparatus is inserted into the through hole 83 to be connected to the ground line 81 by soldering (not shown), and the external connection terminal 63*a* is inserted into the through hole 84 to be connected to an output terminal 82 by soldering (not shown).

Although the print wiring board 80 is provided with a gate bias supplying line and a corresponding through hole and the external connection terminal 64*a* (see FIG. 6) is inserted into the through hole to be connected to the gate bias supplying line by soldering in the state shown in FIG. 8, this is not shown in the drawing.

In the state shown in FIG. 8, most of heat generated in the power transistor TR1 is transmitted through the heat conducting member 66 and released to the outside from the radiation fin 67, and therefore, it is understood that heat transmitted to the external connection terminals 62*a* and 63*a* is suppressed to be small.

Example 2

Figure 9:
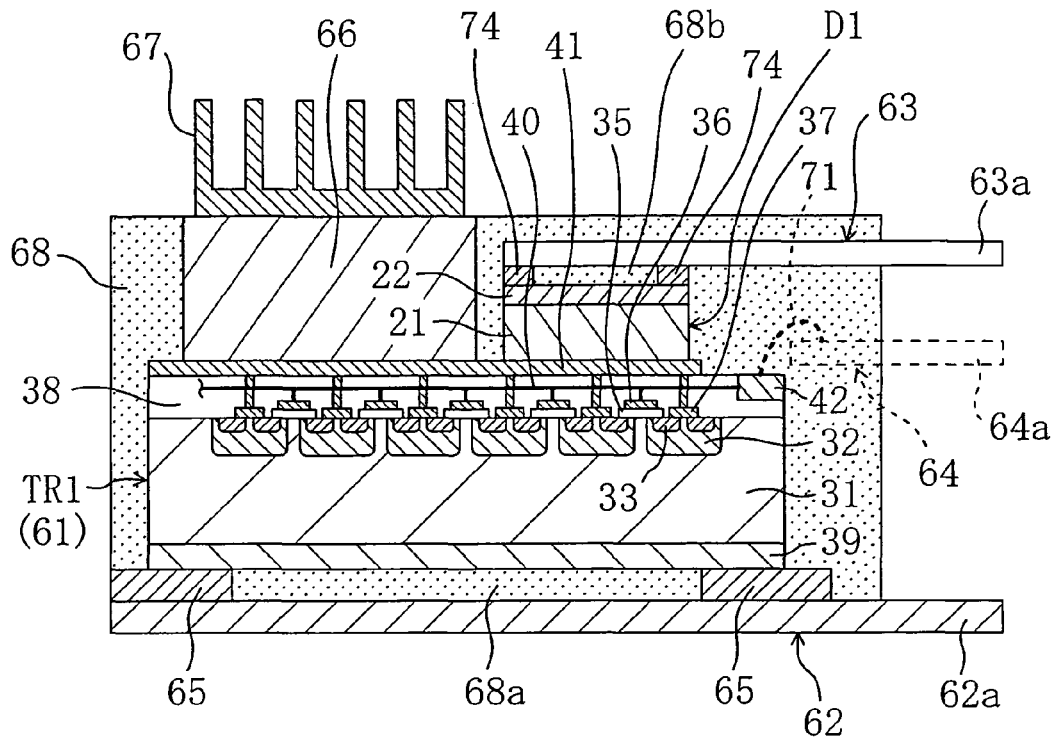
FIG. 9 is a cross-sectional view of a semiconductor apparatus according to Example 2 of Embodiment 2.

FIG. 9 is a cross-sectional view of a semiconductor apparatus according to Example 2 of Embodiment 2. The semiconductor apparatus of this example includes a Schottky diode in addition to a power transistor TR1 having the structure described in Example 1.

The Schottky diode D1 includes an N-type drift layer 21 (active region) occupying most of a SiC substrate made of a wide band gap semiconductor and a Schottky electrode 22 made of Ni in Schottky contact with the N-type drift layer 21. The back face of the N-type drift layer 21 of the Schottky diode D1 is connected to a source interconnect/plug 41 of the power transistor TR1. Also, the Schottky electrode 22 is connected to a base material 63 made of a metal such as Cu through a first intermediate member 74 made of a metal such as Cu, and the tip of the base material 63 works as an external connection terminal 63*a* to be connected to an output terminal portion of a mother substrate. In this example, a portion of an encapsulating material 68 sandwiched between the Schottky electrode 22 of the Schottky diode D1 and the base material 63 corresponds to a second intermediate member 68*b*.

Also, the semiconductor apparatus includes a base material 62 (die pad) that is connected to a back electrode 39 of the power transistor TR1 through the first intermediate member 65 and whose tip works as an external connection terminal 62*a* to be connected to the ground of the mother substrate; and a base material 64 (lead) that is connected to a leading electrode 42 of the power transistor TR1 through a metal fine line 71 and whose tip works as an external connection terminal 64*a*. A portion of the encapsulating material 68 sandwiched between the power transistor TR1 and the base material 62 corresponds to a second intermediate member 68*a* in the same manner as in Example 1.

Also in this example, the fabrication procedures are the same as those of Example 1, and a state where the semiconductor apparatus is mounted on a mother substrate (print wiring board) is the same as that shown in FIG. 8. Accordingly, in this example, while attaining high density packaging by containing the power transistor TR1 and the Schottky diode D1 in one package, heat transmitted to the external connection terminals 62*a* and 63*a* can be suppressed to be small, and hence, reliability in connection to the mother substrate can be kept high.

Instead of employing the structure shown in FIG. 9, the Schottky diode D1 may be disposed between a heat conducting member 66 and the source interconnect/plug 41 of the power transistor TR1. In this case, the Schottky electrode 22 may be connected to the base material 63 through a metal fine line.

Example 3

Figure 10:
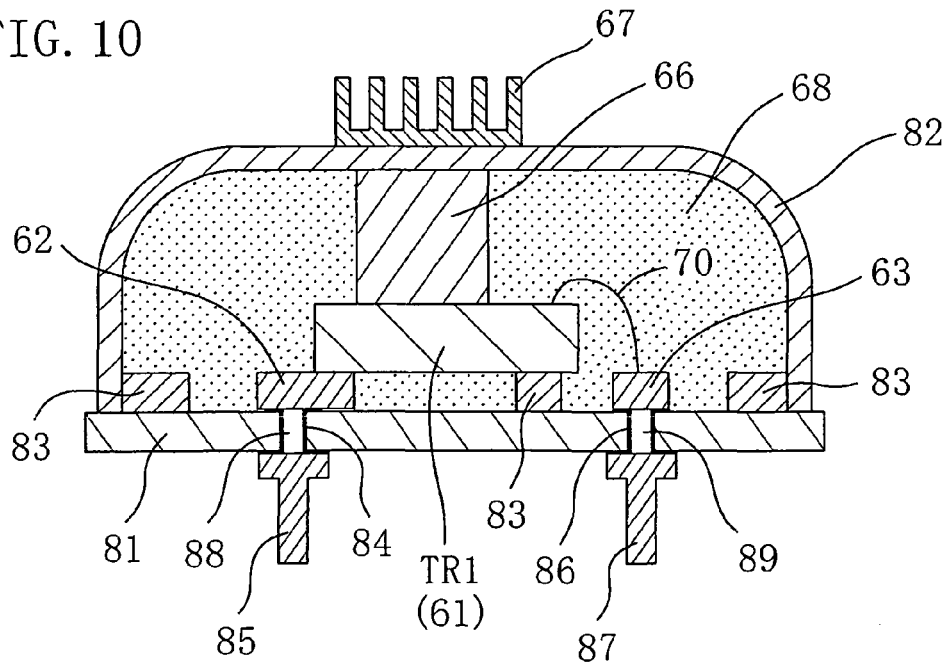
FIG. 10 is a cross-sectional view of a semiconductor apparatus according to Example 3 of Embodiment 2.

FIG. 10 is a cross-sectional view of a semiconductor apparatus according to Example 3 of Embodiment 2. As shown in FIG. 10, the semiconductor apparatus of this example includes a power transistor TR1, that is, a vertical MISFET, having the same structure as those of Examples 1 and 2. As a characteristic of this example, the semiconductor apparatus is not encapsulated with a resin but has a glass encapsulation structure using a metal cap.

The semiconductor apparatus of this example includes, as shown in FIG. 10, a base 81 made of an insulator such as ceramic; base materials 62 and 63 and a supporting member 83 that are patterned from a metal plate of Cu or the like formed on the base 81 and work as base materials; a power transistor TR1 (semiconductor chip 61) mounted on the base material 62 and the supporting member 83; and a heat conducting member 66 provided on the upper face of the power transistor TR1. The base 81 is provided with through holes 88 and 89 corresponding to external connection terminals and electrically conductive films 84 and 86 formed over the inner walls of the through holes 88 and 89 to extend to the upper and lower faces of the base 81 (or electrically conductive rods penetrating through the through holes 88 and 89). Also, external connection terminals 85 and 87 to be connected to a mother substrate (print wiring board) are provided on the electrically conductive films 84 and 86 on the back face of the base 81.

The end of a back electrode (not shown) of the power transistor TR1 is directly connected to the base material 62, and the base material 62 is connected to the external connection terminal 85 through the electrically conductive film 84 (or the electrically conductive rod penetrating through the through hole 88). Also, a source interconnect/plug (not shown) of the power transistor TR1 is connected to the base material 63 through a metal fine line 70, and the base material 63 is connected to the external connection terminal 87 through the electrically conductive film 86 (or the electrically conductive rod penetrating through the through hole 89).

Although not shown in the drawing, a leading electrode is connected to a base material through a metal fine line on a cross-section not shown, and the base material is connected to an external connection terminal through an electrically conductive film formed within a through hole of the base 81 to extend to the upper and lower faces of the base 81.

The power transistor TR1, the base material 62, the base material 63, the metal fine line 70, the supporting member 83 and the heat conducting member 66 are encapsulated, together with an encapsulating material 68 of glass, within a metal cap 82 made of a metal such as copper alloy. The base 81 and the metal cap 82 together form a vessel for encapsulating the semiconductor chip 61 (power transistor TR1), the base materials 62 and 63 and the heat conducting member 66.

It is noted that the encapsulating material 68 may be an inert gas, the air or a gas reduced in the pressure to a very low pressure (what is called a vacuum atmosphere gas).

The upper face of the heat conducting member 66 is in contact with the inner wall of the metal cap 82, and a radiation fin 67 made of a copper alloy plate or the like is provided on the outer wall of the metal cap 82 in a position corresponding to the portion of the inner wall in contact with the heat conducting member 66.

In this example, the base material 62 and the metal fine line 70 are in contact with merely a part of the back face of the power transistor TR1, and the glass with comparatively low heat conductivity occupies most of a region sandwiched between the base 81 and the power transistor TR1. Therefore, heat generated from the power transistor TR1 is minimally transmitted to the base 81 and the base materials 62 and 63 but most of the heat is released through the heat conducting member 66 and the walls of the metal cap 82 from the radiation fin 67. Accordingly, reliability in connection between the external connection terminal and a mother substrate can be improved.

INDUSTRIAL APPLICABILITY

The present invention can be utilized as a semiconductor apparatus or a semiconductor power module including a semiconductor device, such as a MISFET, a MESFET, a Schottky diode, a pn diode, a J-FET or a thyristor, using a wide band gap semiconductor such as silicon carbide (SiC), a nitride of a group III element such like GaN or AlN, or diamond.

The invention claimed is:

1. A semiconductor apparatus comprising:
   a semiconductor chip including a power semiconductor device constructed by using a wide band gap semiconductor, the semiconductor chip having an upper surface and a lower surface opposite to the upper surface;
   a first base material made of an electrically conductive material and electrically connected to a part of the lower surface of said semiconductor chip;
   a heat conducting member coming in contact with a part of the upper surface of said semiconductor chip opposite to the lower surface and releasing heat directly from said semiconductor chip; and
   an encapsulating material for encapsulating said semiconductor chip and said heat conducting member,
   wherein the semiconductor apparatus further comprises a second base material made of a metal material and disposed on a part of said upper surface of said semiconductor chip,
   wherein said power semiconductor device is a vertical element,
   wherein a part of said first base material is extruded outside said encapsulating material and works as a first external connection terminal,
   wherein a part of said second base material is extruded outside said encapsulating material and works as a second external connection terminal,
   wherein a first intermediate member made of an electrically conductive material and a second intermediate member made of a material having lower heat conductivity than said first intermediate member are provided under the lower surface of said semiconductor chip and between said first base material and said semiconductor chip,
   wherein the first intermediate member and the second intermediate member touch the lower surface of the semiconductor chip and the first base material, and an area where the second intermediate member touches the lower surface of the semiconductor chip is larger than an area where the first intermediate member touches the lower surface of the semiconductor chip, and
   wherein the semiconductor chip and the first base material are electrically connected with each other through the first intermediate member, and
   wherein an ohmic electrode is disposed on an entire surface of the lower surface of the semiconductor chip.

2. The semiconductor apparatus of claim 1,
   wherein said power semiconductor device has a region where a current passes at a current density of 50 A/cm$^2$ or more.

3. The semiconductor apparatus of claim 1 or 2,
   wherein said encapsulating material is made of a resin or glass, and
   said heat conducting member is exposed from said encapsulating material.

4. The semiconductor apparatus of claim 3, further comprising a radiation fin that is in contact with said heat conducting member and is extruded outside said encapsulating material.

5. The semiconductor apparatus of claim 1 or 2, further comprising a film for covering said encapsulating material.

6. The semiconductor apparatus of claim 5, further comprising a radiation fin opposing said heat conducting member with said film sandwiched therebetween.

7. The semiconductor apparatus of claim 1,
   further comprising another semiconductor chip that is stacked on said semiconductor chip.

8. The semiconductor apparatus of claim 1,
   wherein said first external connection terminal of said first base material is configured to be mounted on a print wiring board.

9. The semiconductor apparatus of claim 1,
   wherein said wide band gap semiconductor is SiC.

10. The semiconductor apparatus of claim 1, wherein the ohmic electrode comprises nickel.

* * * * *